United States Patent [19]

Stumfall

[11] Patent Number: 4,507,796
[45] Date of Patent: Mar. 26, 1985

[54] ELECTRONIC APPARATUS HAVING LOW RADIO FREQUENCY INTERFERENCE FROM SYSTEM CLOCK SIGNAL

[75] Inventor: David M. Stumfall, Santa Ana, Calif.

[73] Assignee: Printronix, Inc., Irvine, Calif.

[21] Appl. No.: 435,400

[22] Filed: Oct. 20, 1982

[51] Int. Cl.³ .................. H04L 7/00; H03B 29/00
[52] U.S. Cl. .................................. 375/106; 331/78
[58] Field of Search .................. 375/58, 62, 65, 66, 375/106, 107, 108; 455/63, 112, 118, 119; 332/18; 331/78, 177 R, 178

[56] References Cited

U.S. PATENT DOCUMENTS

| | | | |
|---|---|---|---|
| 2,359,649 | 10/1944 | Kahn et al. | 375/106 |
| 3,167,712 | 1/1965 | Young, Jr. et al. | 375/65 |
| 3,354,410 | 11/1967 | Beuscher | 455/63 |
| 3,388,349 | 6/1968 | Ault | 375/108 |
| 3,938,042 | 2/1976 | Gliever et al. | 331/78 |
| 4,068,199 | 1/1978 | Madoff | 375/65 |
| 4,320,355 | 3/1982 | Kawagoe et al. | 331/178 |

Primary Examiner—Benedict V. Safourek
Attorney, Agent, or Firm—Fraser and Bogucki

[57] ABSTRACT

A printer having greatly reduced radio frequency interference from the system clock signal therein is provided by angle modulating the system clock signal in accordance with a desired modulation signal. The modulation signal is chosen so as to spread and thereby reduce the energy level of the system clock signal at the carrier and at the harmonics without interfering with proper detection of the system clock signal by the electronic circuits within the printer requiring the clock signal for proper timing. In a first embodiment the angle modulation is provided by an FM modulator responsive to a modulating signal which is either sinusoidal or randomly varying in nature. In a second embodiment the angle modulation is provided by an arrangement which combines a modulated subcarrier with the basic clock frequency in a phase locked loop.

5 Claims, 6 Drawing Figures

ELECTRONIC APPARATUS HAVING LOW RADIO FREQUENCY INTERFERENCE FROM SYSTEM CLOCK SIGNAL

BACKGROUND OF THE INVENTION

1. Field of the Invention

The present invention relates to electronic circuits in which a high frequency system clock signal or other high frequency source may provide unwanted raido frequency interference and more particularly to electronic circuits in which radio frequency interference from a system clock signal or other high frequency source must be minimized using various techniques.

2. History of the Prior Art

Electronic apparatus such as high speed dot matrix line printers typically includes circuitry for generating a system clock signal required by various circuit components within the apparatus for proper timing. The clock signal must typically be of relatively high frequency such as 4 megahertz or 8 megahertz depending upon the requirements of the standardized integrated circuits typically used within those portions of the apparatus requiring the clock signal for proper timing.

It is frequently necessary to provide some means for reducing the radio frequency interference (RFI) resulting from the relatively high frequency system clock signal. As used herein RFI includes both radio frequency interference and electromagnetic interference (EMI) which is closely related and similar in nature. Troublesome interference may occur at the clock signal frequency if the amplitude of the clock signal is great enough. Greater problems usually occur, however, at the higher frequency harmonics of the system clock signal. This is largely due to the fact that at the higher frequencies of the harmonics, the signal energy is much more readily radiated by conductors and other portions of the printed circuit boards which act as very efficient antenna in the face of the short wavelengths. In one line printer having a system clock frequency of 8 megahertz, for example, RFI tends to be a problem in the 54-60 megahertz range as well as in ranges above 100 megahertz.

Where RFI is a problem in electronic apparatus such as printers, various techniques are often employed so as to reduce the RFI. One common technique is to provide shielding around the radiating portions of the circuitry. In addition to being expensive, such shielding often significantly adds to the weight and space requirements of the electronic apparatus. Another technique commonly employed is to add a terminator in the form of a resistor and a capacitor to each radiating line within the electronic circuitry. However, such terminators are also very expensive in addition to consuming considerable space and adding to the weight of the apparatus.

Accordingly, it would be desirable to provide electronic apparatus in which RFI from high frequency sources therein such as the system clock signal generator can be reduced without the need for expensive and cumbersome devices such as shielding or line terminators.

BRIEF DESCRIPTION OF THE INVENTION

The present invention provides electronic apparatus in which radio frequency interference from a high frequency system clock signal is significantly reduced without the need for shielding, terminator networks and other conventional devices. According to the invention the system clock signal is angle modulated to an extent sufficient to spread the signal energy over a substantial portion of the frequency spectrum while at the same time maintaining the clock signal detectable by the various electronic circuits which require the clock signal for proper timing. The signal energy at the higher harmonics of the clock signal is spread over a broad frequency band so as to greatly reduce the interfering radiation at the higher frequencies despite the tendency of conductors and other portions of the circuit to act as very efficient antenna at such higher frequencies.

In a first embodiment according to the invention the system clock signal is angle modulated using an FM modulator. A modulation signal is provided by either a sine wave oscillator or a noise generator, the noise generator providing a randomly varying signal. The modulation signal is applied through a bandpass filter and a gain adjusting variable resistor to a summing amplifier together with a signal from a phase locked loop. The combination of the two signals is applied to operate a voltage controlled oscillator which provides the modulated system clock signal to an output as well as to a phase detector within the phase locked loop. The phase detector compares the phase of the modulated system clock signal with a base signal from a crystal oscillator and provides a representation of the difference to the summing amplifier. In accordance with a feature of this circuit the modulated system clock signal has a frequency which is a multiple of the crystal oscillator frequency. The modulated system clock signal at the output of the voltage controlled oscillator is reduced in frequency by that multiple before being applied to the phase detector. The compact size of the crystal oscillator together with the low frequency thereof results in very low RFI from the crystal oscillator.

In a second embodiment according to the invention an angle modulated system clock signal is provided by a phase locked loop having one input coupled to receive a base signal from a crystal oscillator and a second input coupled to receive a modulated subcarrier. The modulated subcarrier is provided by an oscillator which generates the modulating signal and a voltage controlled oscillator which responds to the modulating signal.

BRIEF DESCRIPTION OF THE DRAWINGS

The foregoing and other objects, features and advantages of the invention will be apparent from the following more particular description of preferred embodiments of the invention, as illustrated in the accompanying drawings, in which.

DETAILED DESCRIPTION

Figure 1:
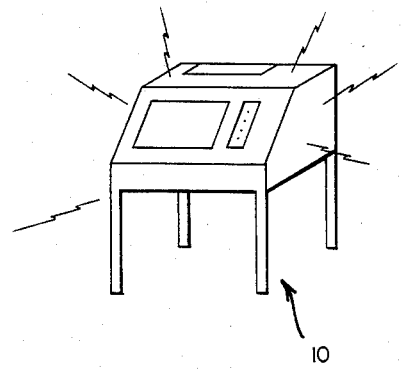
FIG. 1 is a perspective view of a dot matrix line printer illustrating one type of electronic apparatus which can have radio frequency interference from a high frequency system clock signal generated and utilized therein.

FIG. 1 depicts a dot matrix line printer 10 which may be of the type shown in U.S. Pat. No. 3,941,051 of Barrus et al, PRINTER SYSTEM, issued Mar. 2, 1976 and commonly assigned with the present application. While not shown in FIG. 1, the printer 10 includes various electronc circuits for performing functions necessary within a dot matrix line printer. The circuits perform such functions as receiving and storing incoming data to be printed and then arranging such data for printing in a format usable by a reciprocating hammer bank having a plurality of hammers mounted in side-by-side relation along the length thereof. Such electronic circuits require a system clock signal so that proper synchronization and timing may be maintained. Accordingly, the printer 10 includes an oscillator or other appropriate circuit for generating a system clock signal, which signal is typically of 4 megahertz or 8 megahertz frequency depending upon the type of printer involved and the particular integrated circuits used therein.

As in the case of any relatively high frequency signal of some amplitude, the system clock signal in the printer 10 provides some radio frequency interference (RFI). The RFI from the system clock signal is usually insignificant at the actual frequency of the clock signal but may become a problem at higher frequencies due to the harmonics of the clock signal. Where RFI constitutes a problem, various measures such as shielding and terminator networks may be employed to reduce the RFI. However, shielding is relatively expensive and also consumes a substantial amount of space within the printer 10. Terminator networks have similar limitations.

According to the invention, RFI from the printer 10 is substantially reduced without the need for expensive, space-consuming items such as shielding and terminator networks. The system clock signal within the printer 10 is angle modulated using an appropriate modulation signal. This has the effect of spreading the energy of the system clock signal over a wide frequency band. Harmonics of the clock signal are substantially reduced in amplitude with the result that previously troublesome RFI is substantially reduced. At the same time the modulation signal is chosen so that the modulation of the system clock signal does not affect proper and accurate detection thereof by the various electronic circuits within the printer 10.

The printer 10 shown in FIG. 1 comprises but one example of electronic apparatus of the type in which radio frequency interference resulting from high frequency signals generated therein may be a problem. It will be understood by those skilled in the art that the principles of the invention apply as well to other types of electronic apparatus and not just to the printer so illustrated.

Figure 2:
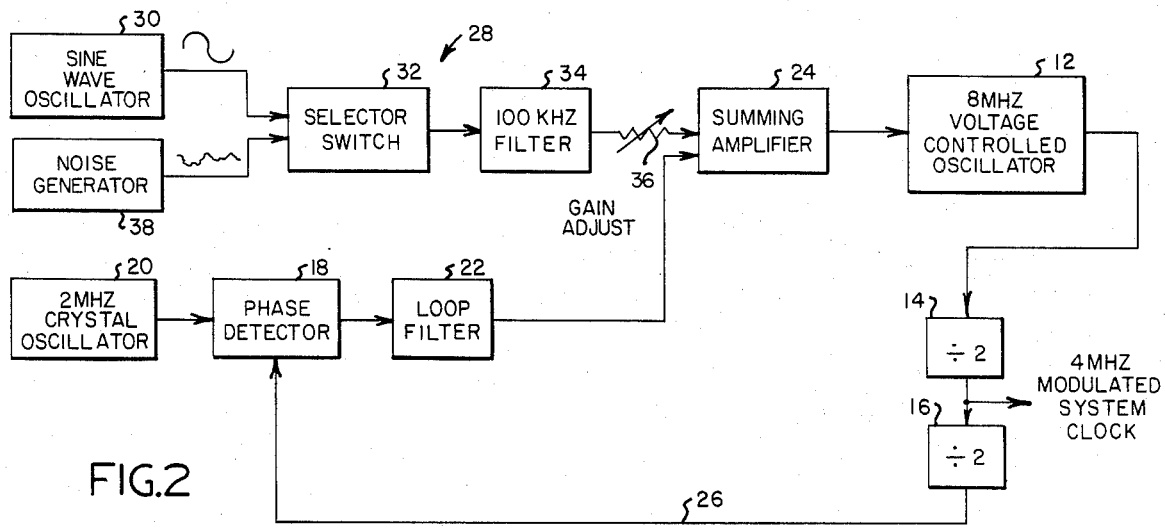
FIG. 2 is a block diagram of one arrangement for generating an angle modulated system clock signal in accordance with the invention using FM modulation.

FIG. 2 depicts an arrangement for generating a modulated system clock signal in accordance with the invention. The arrangement of FIG. 2 utilizes a voltage controlled oscillator 12 having a fundamental frequency of 8 megahertz together with a frequency division circuit 14 which divides the frequency at the output of the voltage controlled oscillator 12 by 2 to provide a 4 megahertz modulated system clock signal. In addition to being applied to various electronic circuits within the printer 10, the 4 megahertz system clock signal has the frequency thereof divided by 2 by a frequency division circuit 16 so as to provide a signal of 2 mgahertz fundamental frequency to one of the inputs of a phase detector 18. A second input of the phase detector 18 is coupled to receive a base signal in the form of a 2 megahertz signal from a crystal oscillator 20. The phase detector 18 determines any difference in phase between the signals at the two different inputs thereof and provides a DC signal representing any difference therebetween via a loop filter 22 to one of the inputs of a summing amplifier 24 having an output coupled to the voltage controlled oscillator 12. The loop filter 22 limits the bandwidth of a phase locked loop 26 defined by the voltage controlled oscillator 12, the frequency division circuits 14 and 16, the phase detector 18, the loop filter 22 and the summing amplifier 24.

In addition to generating a system clock signal, the phase locked loop 26 acts as an FM modulator in conjunction with a circuit 28 for generating a modulating signal and applying it to a second input of the summing amplifier 24. The circuit 28 includes a sine wave oscillator 30 coupled to the summing amplifier 24 through a selector switch 32, a filter 34 and a variable resistor 36. With the selector switch 32 appropriately positioned, a sine wave generated by the oscillator 30 is passed via the filter 34 and the variable resistor 36 to the summing amplifier 24 where it is combined with the DC signal from the phase detector 18 as limited by the loop filter 20 prior to being applied to vary the frequency of the voltage controlled oscillator 12 about the center or nominal frequency thereof.

In the present example the sine wave oscillator 30 has a frequency of 100 kilohertz. The filter 34 has a bandwidth of 100 kilohertz, insuring that the signal from the oscillator 30 does not exceed this bandwidth. The filter 34 therefore determines $F_m$ which is the rate of frequency modulation. The variable resistor 36 comprises a gain adjustment. The resistor 36 selects $\Delta f$ which is the frequency spectrum or deviation. The rate of frequency modulation and the frequency spectrum determine the modulation index in accordance with the formula $$Im = \Delta f / Fm,$$

where $I_m$ is the modulation index. In the present example both $\Delta f$ and $Fm$ are 100 kilohertz, with the result that the modulation index $I_m$ is 1.

When the modulation signal frequency of 100 kilohertz is compared with the 8 megahertz frequency of the voltage controlled oscillator 12, the result is a 1.25% error in the system clock signal due to the presence of the frequency modulation. Because the various electronic circuits within the printer 10 are relatively slow to respond to the system clock signal, an error of this magnitude is not great enough to affect the ability of such circuits to accurately detect the system clock signal and to obtain the necessary timing therefrom. Such circuits tend to see only the average or carrier frequency of the modulated signal which is the clock signal frequency.

Figure 6:
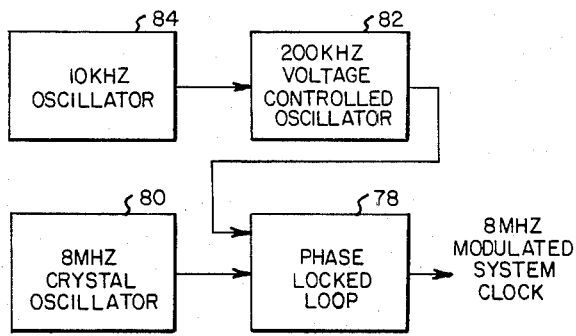
FIG. 6 is a block diagram of an alternative arrangement for providing an angle modulated system clock signal in accordance with the invention.

The frequency modulation arrangement of FIG. 2 comprises an example of the angle modulation technique of the invention. Frequency modulation is a form of angle modulation which is more broadly defined so as to encompass any type of modulation in which the angle of a sine wave carrier is the characteristic varied from its reference value in accordance with the modulating signal. In addition to frequency modulation, angle modulation may include other forms of modulation such as phase modulation. FIG. 6 which illustrates a still further form of angle modulation is discussed below.

Figure 3:
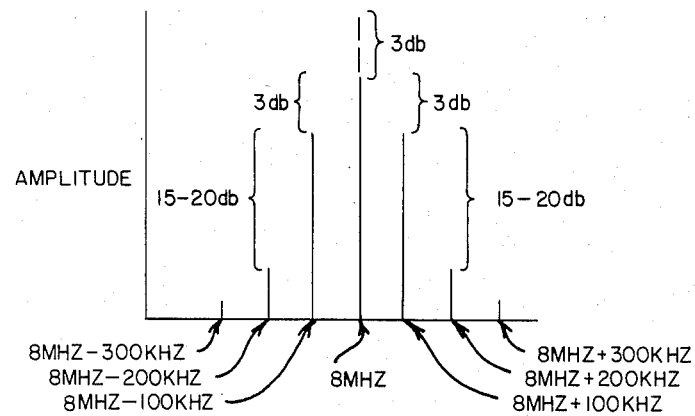
FIG. 3 is a graph of the amplitude of the modulated system clock signal produced by the arrangement of FIG. 2 at different frequencies.

FIG. 3 shows the amplitude of signals within the arrangement of FIG. 2 at the basic carrier frequency of the voltage controlled oscillator 12 of 8 megahertz and at surrounding frequencies which are multiples of the modulating frequency of 100 kilohertz. The frequency modulation with a modulation index (Im) of 1 has been found to reduce the signal amplitude at 8 megahertz carrier by a ratio of 2:1 or by approximately 3 decibels. Some of this power is transferred to the sidebands. At 8 megahertz±100 kilohertz the signal amplitude is approximately 3 decibels less than the signal amplitude at 8 megahertz. At 8 megahertz±200 kilohertz the signal amplitude is reduced by another 15-20 decibels. At 8 megahertz±300 kilohertz the signal amplitude is reduced even more.

The graph of FIG. 3 illustrates the fact that angle modulation in accordance with the invention has the effect of spreading the signal energy over a relatively wide frequency band. This has the effect of distributing the signal energy in a generally uniform way which greatly minimizes the likelihood of detectable radiation at certain high frequency bands.

Figure 4:
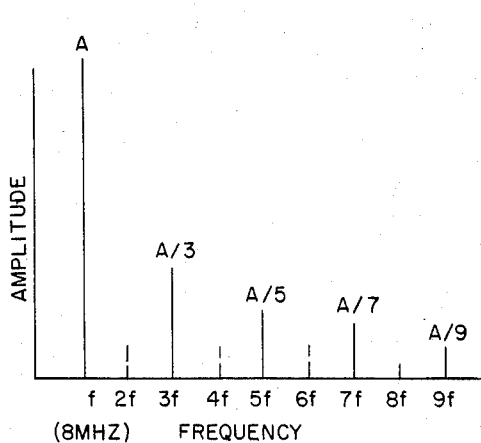
FIG. 4 is a graph of the amplitude of the modulated system clock signal produced by the arrangement of FIG. 2 at the fundamental clock frequency and at various different upper harmonics thereof.

FIG. 4 is a graph depicting signal amplitude at the fundamental or carrier frequency f of 8 megahertz and at the various harmonics thereof. Again, FIG. 4 depicts the case where the modulation index (Im) is 1 at the fundamental frequency f. FIG. 4 is useful in showing the substantially reduced amplitudes which exist at the various harmonics due to the angle modulation. This occurs because the modulation index Im increases with increasing harmonic number. In the present example Im=3 at the third harmonic, Im=5 at the fifth harmonic, and so forth. If the system clock signal has a waveform which is generally squarewave in nature, then the signals at the even numbered harmonics such as 2f and 4f are insignificant. If the signal amplitude at the fundamental or carrier frequency f has a value A, then the signal amplitude at the third harmonic 3f is A/3. The signal amplitude diminishes even more at higher harmonics, dropping to A/5 at 5f, to A/7 at 7f and to A/9 at 9f. As previously noted RFI is typically a greater problem at the harmonics because of the high antenna efficiency of various portions of the circuits at the higher frequencies. Despite this, RFI is relatively small in arrangements according to the invention because of the very low signal amplitudes at the higher harmonics as illustrated in FIG. 4.

Use of the sine wave oscillator 30 to provide a sinusoidal modulation signal in the arrangement of FIG. 2 has been found to provide a substantial reduction in RFI at virtually all frequencies within a spectrum extending to about 1 gigahertz at its upper end. Nevertheless, troublesome amounts of RFI may occasionally be observed at selected small frequency bands within the spectrum. This is due to the fact that overlapping portions of the upper and lower sidebands of adjacent harmonics will occasionally reinforce each other so as to increase the signal amplitude within the small portion of the frequency spectrum thereby.

This problem is generally avoided by use of a noise generator 38 shown in FIG. 2 to provide the modulating signal to the summing amplifier 24. With the selector switch 32 properly positioned, the randomly varying noise signal produced by the generator 38 is passed to the summing amplifier 24 via the filter 34 and the variable resistor 36. The filter 34 insures that any frequencies above 100 kilohertz are eliminated. Again, the variable resistor 36 provides gain adjustment. The modulation signal provided by the noise generator 38 has the effect of spreading the energy over a large portion of the frequency spectrum in the same manner as provided by the sine wave modulation signal from the oscillator 30. At the same time, however, the randomly varying nature of the noise signal of the generator 38 greatly reduces the probability of reinforcement of overlapping side bands at the higher harmonics.

Figure 5:
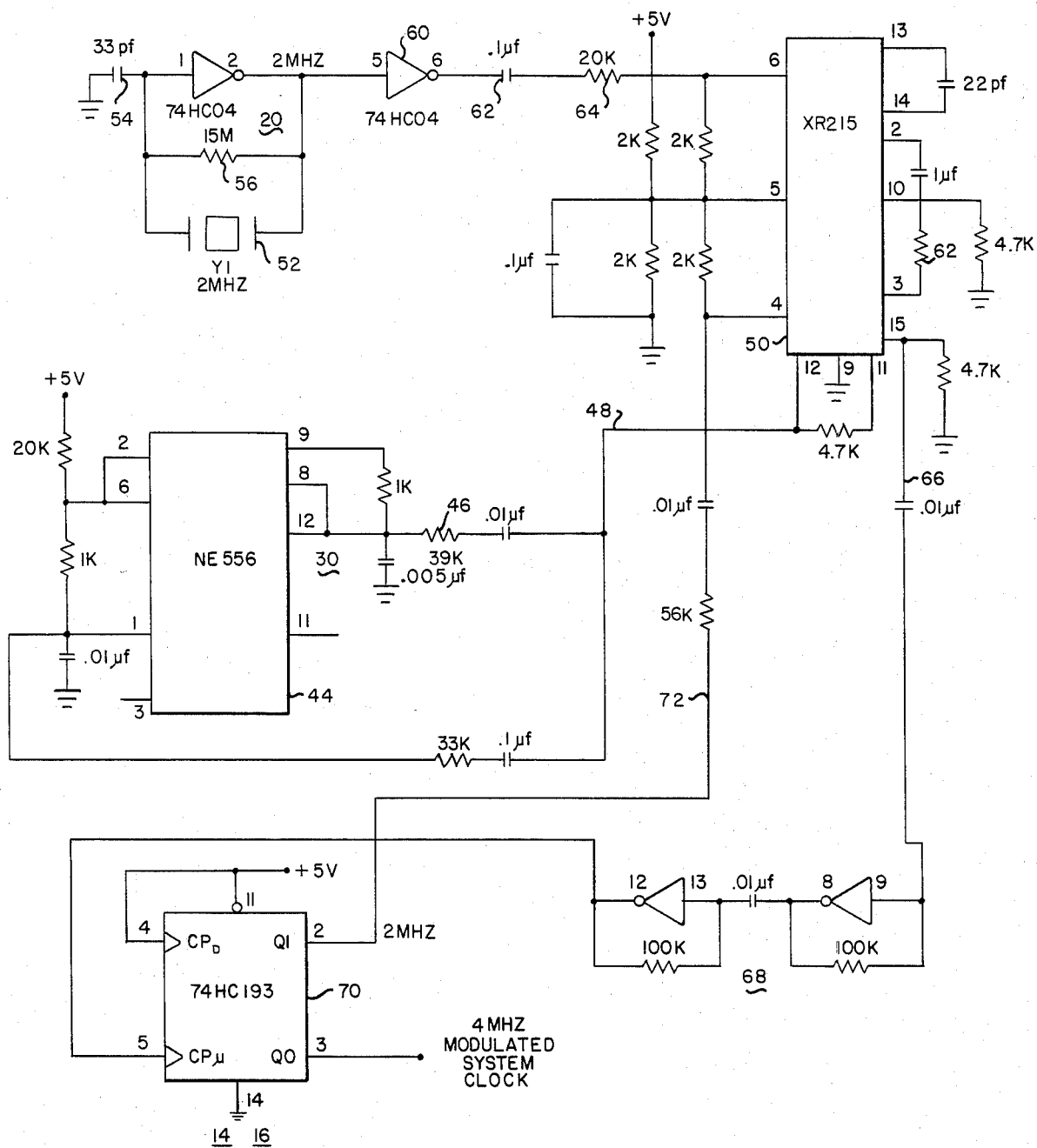
FIG. 5 is a schematic diagram of a circuit for implementing the arrangement of FIG. 2.

FIG. 5 depicts in schematic diagram form a specific example of the arrangement of FIG. 2. In the arrangement of FIG. 5 the noise generator 38 and the selector switch 32 are not present. The sine wave oscillator 30 is comprised of an NE556 integrated circuit 44 with appropriate external components and connections. Such circuit provides a very closely regulated and controlled sine wave of 100 kilohertz frequency. Accordingly, the filter 34 shown in FIG. 2 is not needed. The variable resistor 36 which provides gain adjustment is also not present in the arrangement of FIG. 5. Instead a 39K resistor 46 provides a fixed gain previously determined to be adequate for the circuit.

The sinusoidal modulating signal provided by the integrated circuit 44 is passed via a lead 48 to the summing amplifier 24 which is comprised of an XR215 integrated circuit 50 together with appropriate external components and connections. The integrated circuit 50 and its appropriate components also comprise the voltage controlled oscillator 12, the phase detector 18 and the loop filter 22.

The 2 megahertz crystal oscillator 20 is shown in FIG. 5 as including a crystal 52 together with a capacitor 54, a resistor 56 and an inverter 58. The 2 megahertz signal from the crystal oscillator 20 is applied to the phase detector 18 within the integrated circuit 50 via a buffer 60, a capacitor 62 and a resistor 64.

The number 15 terminal of the integrated circuit 50 is coupled via a lead 66 through a buffer 68 to a 74HC193 circuit 70 connected to operate as a mod 2/4 counter. The circuit 70 comprises the frequency division circuits 14 and 16 shown in FIG. 2. The number 3 terminal of the circuit 70 provides the 4 megahertz modulated system clock signal to the other electronic circuit within the printer 10. The number 2 terminal of the integrated circuit 70 provides the 2 megahertz signal which is passed via a lead 72 to the phase detector within the integrated circuit 50.

It will be appreciated that the 2 megahertz crystal oscillator 20 being very small and compact in size produces very little RFI. The RFI is even further minimized by the frequency division performed by the arrangement of FIG. 2 so as to provide the oscillator 20 with a frequency of 2 megahertz rather than 8 megahertz. The 2 megahertz signal has less radiation at the higher harmonics thereof than would an 8 megahertz signal.

An alternative arrangement for providing an angle modulated system clock signal in accordance with the invention is illustrated in FIG. 6. The arrangement of FIG. 6 produces an 8 megahertz clock signal using a phase locked loop 78 having a pair of inputs, one of which is coupled to an 8 megahertz crystal oscillator 80 for providing a base or carrier signal of 8 megahertz frequency. The other input of the phase locked loop 78 is coupled to receive the modulating signal provided by a 200 kilohertz voltage controlled oscillator 82. The voltage controlled oscillator 82 is in turn fed by a 10 kilohertz oscillator 84. The oscillator 84 and the voltage controlled oscillator 82 combine to produce a modulated subcarrier which has a frequency spectrum of 190–210 kilohertz. This signal is applied as the modulating signal to the phase locked loop 78 together with the carrier signal from the crystal oscillator 80. As in the case of the frequency modulating arrangement of FIG. 2, this has the effect of substantially spreading out the signal energy about the 8 megahertz carrier frequency, so as to again substantially reduce RFI across a broad frequency spectrum.

While the invention has been particularly shown and described with reference to particular embodiments thereof, it will be understood by those skilled in the art that the foregoing and other changes in form and details may be made therein without departing from the spirit and scope of the invention.

What is claimed is:

1. Apparatus having low radio frequency interference from a clock signal generator therein comprising:

a base crystal oscillator for providing a base signal of given frequency;

a voltage controlled oscillator for providing a modulated system clock signal having a desired nominal frequency;

a phase detector having a pair or inputs coupled to receive the base signal and the clock signal and an output for providing a phase signal;

means for providing a modulating signal, said means including means for generating a varying signal and a bandpass filter coupled to receive the varying signal and provide the modulating signal;

means for summing the modulating signal and the phase signal to provide a combined signal to the voltage controlled oscillator; and at least one electronic circuit requiring a clock signal of the desired nominal frequency for proper timing, the electronic circuit being coupled to receive the modulated system clock signal.

2. The invention set forth in claim 1, wherein the means for providing a modulating signal further includes a variable resistor coupled to the bandpass filter for providing the modulating signal.

3. The invention set forth in claim 2, wherein the means for generating a varying signal comprises a sine wave oscillator.

4. The invention set forth in claim 1, wherein the means for generating a varying signal comprises a noise generator.

5. The invention set forth in claim 1, wherein the desired nominal frequency of the clock signal is a chosen multiple of the given frequency of the base signal, and further including means coupled between the voltage controlled oscillator and the phase detector for reducing the frequency of the modulated system clock signal by the chosen multiple before applying it to the phase detector.

* * * * *